April 11, 1961 J. R. SHONNARD 2,979,673

TUNING FORK OSCILLATOR HAVING SEPARATE MAGNETOSTRICTIVE AND MAGNETOMOTIVE CONTROLS

Filed July 26, 1957

INVENTOR
JOHN R. SHONNARD
BY John J. Logan
ATTORNEY 2,979,673

TUNING FORK OSCILLATOR HAVING SEPARATE MAGNETOSTRICTIVE AND MAGNETOMOTIVE CONTROLS

John R. Shonnard, Montclair, N.J., assignor, by mesne assignments, to Westrex Corporation, New York, N.Y., a corporation of Delaware Filed July 26, 1957, Ser. No. 674,478

13 Claims. (Cl. 331—157)

This invention relates to an oscillator employing a tuning fork or other similar mechanical resonator and it particularly relates to an oscillator which is substantially insensitive to or unaffected by environmental vibrations or external impact. Examples of such vibrations are those that would be encountered when the oscillator is used in portable or moving apparatus, or such as those encountered where the oscillator is subjected to great acceleration or deceleration forces, for example when used in control apparatus for projectiles, missiles, etc.

The generalized object of the invention is to provide a precision oscillator employing a mechanically resonant element which is controlled by separate magnetostrictive and magnetomotive units so arranged that the oscillator, so far as oscillator frequency is concerned, is relatively insensitive to external shock or changes in acceleration or deceleration of the oscillator supporting means.

A principal object of the invention is to provide a novel organization of magnetostrictive and magnetomotive controls for a tuning fork to reduce to the greatest extent possible the detection and amplification of such undesired vibrations as may be produced when the fork is subjected to external mechanical vibration.

Another principal object is to provide a precision tuning fork oscillator of rugged compact construction, and one having a high order of frequency stability.

A feature of the invention relates to a tuning fork oscillator which is provided with separate magnetostrictive and magnetomotive controls so arranged as to avoid undesirable coupling therebetween.

Another feature relates to a tuning fork oscillator having at least a part of the fork constituted of magnetostrictive material, the fork driving system and the fork pickup or output system being so arranged that undesirable coupling therebetween is substantially eliminated, only one of said systems utilizing magnetostriction.

Another feature relates to a fork oscillator having a tuning fork which is constructed in part of magnetostrictive material which is associated with a respective control winding, and a pair of magnetomotive windings symmetrically arranged with respect to the fork tines whereby the fork can be kept in continuous vibration at a precise frequency while segregating the magnetostrictive control from the magnetomotive control.

A further feature relates to the novel organization, arrangement and relative location of parts including separate magnetostrictive and magnetomotive controls for a tuning fork, whereby the tuning fork is constrained to operate at its inherent natural frequency so as to be substantially independent of external mechanical forces.

Other features and advantages not specifically enumerated will appear from the ensuing descriptions, the appended claims, and the attached drawing.

In the drawing, which shows by way of example certain preferred embodiments,

Figure 2:
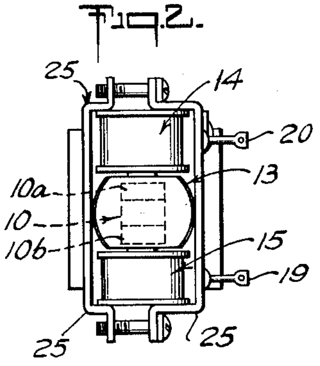
Figs. 1 and 2 are, respectively, plan and side views of a sealed fork unit embodying the invention.
Figure 1:
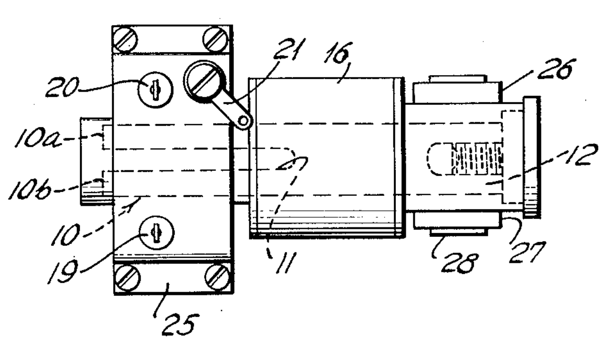

Referring to Figs. 1 and 2, the fork unit is shown as consisting of a tuning fork 10, having tines 10*a*, 10*b* formed integrally with the fork throat portion 11 and the fork heel 12. The tuning fork is enclosed in a sealed evacuated or gas-filled envelope or bulb 13. The fork may be of laminated construction, such as described in U.S. Patent 1,880,923 to B. E. Eisenhour, so as to achieve temperature compensation. In other respects the sealed fork is preferably of the kind described in U.S. Patent 2,469,951 to A. G. Cooley. As described in said patent, the tube or envelope 13 may be of stainless steel or the like which is non-magnetic so that the electromagnets 14, 15 of the magnetomotive system which are associated with the fork tines can be mounted outside the tube 13, while exerting their magnetic linkage with the fork tines. If desired, the tube 13 may be of glass, ceramic or other suitable material instead of metal.

In accordance with one feature of the invention, the fork 10 is composed at least in part of a magnetostrictive metal or alloy such as nickel or one of the well known nickel-iron magnetostrictive alloys, preferably those exhibiting the magnetostrictive effect to a marked extent. In accordance with one phase of the invention, the fork is provided with a coil or winding 16 surrounding the fork, preferably adjacent the throat 11 between the tines and the heel 12. The coil 16 may be used either as the drive or pickup element in the usual and well known oscillator circuit used to maintain the fork in oscillation, as will be explained in connection with Figs. 3 and 4. The coil 16 and the contiguous portion of the fork constitute the magnetostrictive part of the fork system. The tines of the fork are provided with symmetrically mounted electromagnets 14, 15 which constitute the magnetomotive part of the fork system. This magnetomotive system is balanced with respect to the stray field of the coil 16 so that no undesirable magnetic coupling exists between the magnetomotive system and the magnetostrictive system, and those systems are effectively segregated. The magnets 14 and 15 may be used as drive elements, and the coil 16 may be used as the pickup element, as will be explained in connection with Fig. 3. On the other hand, the coil 16 may be used as the driving element and the electromagnets 14 and 15 may be used as the pickup elements. Preferably, although not necessarily, each of the electromagnets 14, 15 comprises a U-shaped magnetic core 17, 18 each of which may be a permanent magnet in itself, or an iron core polarized by a suitable permanent magnet. Each leg of core 17 carries a coil 14*a*, 14*b* which together constitute the electromagnet 14. Likewise each leg of magnetic core 18 carries a coil 15*a*, 15*b* which together constitute the electromagnet 15. The coils 14*a*, 14*b* and 15*a*, 15*b* can be connected in series as shown in Figs. 3 and 4.

The device can be provided with three terminals, 19, 20, 21. Terminal 21 may be the common grounding terminal and is also connected to the fork itself which is thereby grounded. Terminal 19 may be connected to the output terminal 22 of a suitable amplifier 23 and the terminal 20 may be connected to the input terminal 24 of the amplifier. The amplifier 23 typifies the conventional feedback arrangement used to supply energy to the drive system to maintain the fork in vibration. As shown in Fig. 2, the electromagnets 14, 15 are clamped in place on the tube 13 by suitable clamping means 25. In order further to improve the efficiency of the magnetostrictive system, a pair of permanent magnets 26, 27 may be clamped against the tube 13 near the heel portion 12 of the fork by a suitable clamp 28.

It will be observed that the electromagnets 14, 15 are symmetrically located with respect to the coil 16, which latter is associated with the magnetostrictive portion of the system and there is no undesirable inductive coupling between the magnetomotive portion of the system and the magnetostrictive portion of the system, as will be explained in detail in connection with Figs. 3 and 4. It has been found that this segregation of the magnetostrictive and magnetomotive portions of the system is essential for maximum frequency stability since the frequency of the fork is affected by changes in the driving power. The symmetrical or balanced arrangement of the magnetomotive portion of the system has the further important advantage that it is substantially unaffected by shaking or vibration of the fork as a whole, such as may occur where the fork assembly is mounted in a portable apparatus or in a moving device such as a projectile or missile, as will be explained in connection with Fig. 5.

Figure 3:
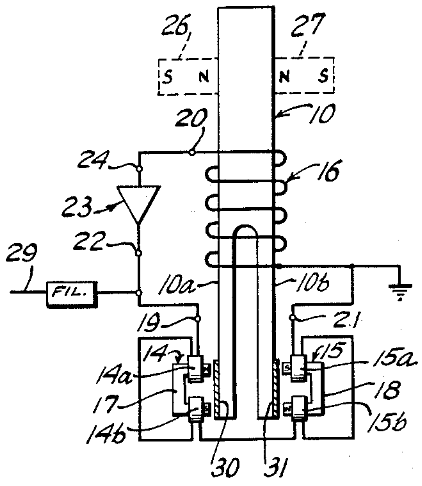
Fig. 3 is a composite structural and circuit diagram of the fork of Figs. 1 and 2 embodied in an oscillator.
Figure 4:
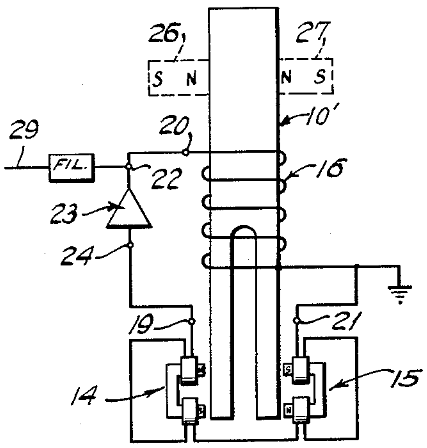
Fig. 4 is a modification of the oscillator shown in Fig. 3.

Referring to Fig. 3, the fork 10 as shown is arranged with the coil 16 acting as the pickup coil or oscillator output for the complete oscillatory system, whereas the electromagnets 14 and 15 act as the driving element to maintain the fork in continuous vibration. As the fork tines are vibrating the cyclic strain in the body of the fork generates in the coil 16 by magnetostrictive action alternating current signals of the same frequency as the natural frequency of vibration of the fork. The magnetostrictive output of coil 16 is then amplified in a suitable amplifier 23, such as a grid controlled amplifier, transistor amplifier, or the like, the output terminal 22 of which is connected to the oscillator load circuit 29. A portion of the output current at the amplifier output terminal 22 is employed to energize the electromagnets 14 and 15 which drive the fork by magnetomotive force to maintain it in continuous oscillation.

As pointed out above and in accordance with a feature of the invention, the electromagnets 14 and 15 which constitute the magnetomotive drive system are arranged symmetrically with respect to each other and with respect to the fork tines, and also with respect to the coil 16, with the result that the fork is substantially insensitive to external vibration or impact that would vibrate the fork with a reed-like movement. Such undesirable reed-like movement would otherwise generate a non-resonant frequency in the oscillator circuit and therefore would affect the frequency of the oscillatory signal at the output terminal 22.

For the purpose of increasing the efficiency of the magnetomotive system, for example at the regions where the material of the fork is not ferromagnetic, the ends of the fork tines may have attached thereto tips or blocks 30, 31 of steel or other ferromagnetic material, preferably of a ferromagnetic alloy having a relative permeability much greater than unity. The fork 10 may be composed of diamagnetic, paramagnetic or of ferromagnetic material. Paramagnetic materials have a relative permeability slightly greater than unity, whereas ferromagnetic alloys have a relative permeability much greater than unity.

Fig. 4 shows a modification similar to that of Fig. 3 but with the function of the magnetomotive section and the magnetostrictive section reversed. The parts of Fig. 4 which are the same as those of Figs. 1–3 bears the same corresponding designation numerals. In Fig. 4 the fork 10' instead of being mainly of magnetostrictive material with ferromagnetic tips (as in Fig. 3), may be composed entirely of ferromagnetic material, although if desired the fork 10' can be of diamagnetic or paramagnetic material and it may have attached to the fork tines ferromagnetic tips similar to 30, 31 of Fig. 3.

In Fig. 4 the winding 16 acts by magnetostrictive effect on the fork, which it surrounds, it being observed that both in Figs. 3 and 4 the winding 16 preferably surrounds the fork so that in one case (Fig. 3) the cyclic strain of the fork body induces voltages in the winding 16 by magnetostrictive action; whereas in Fig. 4 the current which flows through the winding 16 from the output of amplifier 23 causes magnetostrictive movement or vibration in the fork tines, which, of course, magnetomotively induces corresponding voltages in the electromagnets 14, 15. Those electromagnets are then connected to the input terminal 24 of amplifier 23, whereas the output terminal 22 of amplifier 23 is connected to the non-grounded end of winding 16.

As will be explained hereinbelow, the magnetomotive section of the oscillatory fork system, and the magnetostrictive section of the oscillatory fork system, are segregated so that the driving section is isolated from the pickup section. With such an arrangement there is no interaction tending to vary the energy employed for driving the fork, which variation would affect the fork frequency undesirably.

Figure 5:
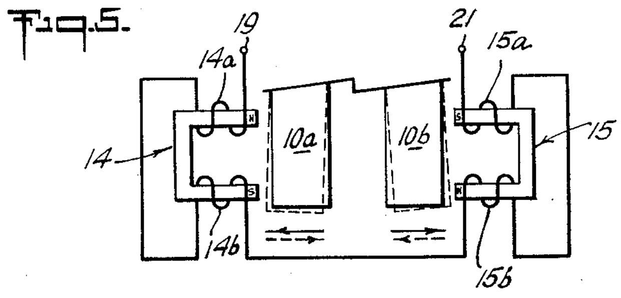
Fig. 5 is a fragmentary enlarged view to explain the manner in which the symmetrical arrangement of the magnetomotive system with respect to the fork tines is used to avoid the tendency of the fork to vibrate as a reed when subjected to external shock or impact.

Fig. 5 illustrates clearly how the symmetrical arrangement of the electromagnets 14 and 15 renders the fork insensitive to reed-like vibration of the whole fork about its base.

It will be noted that the magnets 14 and 15 are arranged on opposite sides of the tines of the fork 10 with their coils connected in series relation. The polarity of the magnetized coils of the magnets is arranged in opposite relation so that the stray field from the magnetostrictive control winding 16 induces equal and opposite potentials in the two magnets 14, 15, thus avoiding the inductive effect of the said winding 16 on the magnets 14 and 15. The normal vibration of the tines, as indicated by dotted lines in Fig. 5 and by the arrows, produces an alternate increase and decrease in the spacing between the tines. Under these conditions a maximum alternating current is induced by magnetomotive force in the system represented by the two magnets 14 and 15. Under conditions of extremely high external shock or vibration of the fork unit as a whole, a reed-type vibration may be imparted to the fork in which the entire fork is vibrated by the shock from side to side in the plane of the magnets 14 and 15. Under those conditions the two tines move in phase unison back and forth as if the two tines were a single reed, and in that event it will be noted that the voltage induced across the terminals of the magnet 14 will be opposite in phase to that induced across the terminals of the magnet 15. Therefore, the sum of the voltages induced by such external vibration is negligible and the sensibility of the fork to external shock or vibration tending to cause reed-like vibration of the fork is greatly reduced. It is found in practice that this arrangement is superior to the use of shock mounts for the fork, but if desired, any well known shock mounts may also be employed in the conventional manner.

The invention is not limited to any particular type feedback arrangement including the amplifier which is represented schematically in the drawing by the block 23, so long as the amplifier is substantially asymmetrically conductive and provides the required phase relation between the excitation pickup and driving windings. A typical such amplifier is disclosed in U.S. Patent No. 2,478,330. The expression magnetomotive is used herein in contradistinction to magnetostrictive and contemplates the provision of a magnetic circuit including a winding and a magnetic member whether paramagnetic or diamagnetic, for example of ferromagnetic material. Movement of the magnetic member with respect to the winding generates corresponding voltages in the winding by change in magnetic reluctance of the path including said member and said winding. Vice versa, excitation currents applied to the winding cause the member to move by magnetomotive force.

Various changes and modifications may be made in the disclosed embodiments without departing from the spirit and scope of the invention.

What is claimed is:

1. A frequency stabilized oscillator for self-generation of sustained oscillations comprising a vibratory member having a vibratory deflectable portion and constructed at least in part of magnetostrictive material, a first winding inductively coupled to said magnetostrictive part to drive said member by magnetostrictive action, a second winding magnetomotively coupled to said deflectable portion, and circuit connections for causing one of said windings to act as a voltage pickup while the other of said windings acts as a driving winding for maintaining said member in vibration at its natural resonant frequency, said circuit connections including feed back means for feeding back a portion of the oscillating voltage from the pick-up winding to the driving winding to maintain said member in continuous oscillation.

2. A frequency stabilized oscillator for self-generation of sustained oscillations comprising a vibratory member having a vibratory deflectable portion constructed at least in part of magnetostrictive material, a first winding, a second winding, one of said windings being a driving winding for maintaining the said member in continuous vibration at its natural resonant frequency, the other of said windings being a pickup winding for translating the said vibrations into an electrical frequency, one of said windings being positioned adjacent to the magnetostrictive portion of said member, to effect vibration of the member, the other winding being in magnetoinductive relation to a magnetic circuit constituted in part at least by a vibratory portion of said member, and circuit connections for feeding back a portion of the oscillating voltage from the pick-up winding to the driving winding to maintain said member in continuous oscillation.

3. A frequency stabilized oscillator for self-generation of sustained oscillations comprising a tuning fork constructed at least in part of magnetostrictive material, a first magnetostriction control winding in coupled relation with said magnetostrictive portion of the fork, and magnetomotive windings, one for each of the fork tines, said magnetomotive windings being symmetrically positioned with respect to said first winding, and being coupled to said fork for magnetomotive action therewith, and circuit connections for feeding back voltages between the first winding and the magnetomotive windings to maintain said fork in continuous oscillation.

4. A frequency stabilized oscillator for self-generation of sustained oscillations comprising a tuning fork having a magnetostrictive section and a magnetomotive section, a magnetostrictive pickup winding coupled with said magnetostrictive section, a magnetomotive fork driving winding coupled with said magnetomotive section, and means including feed back circuit connections between both said windings to provide self-sustaining driving energy to the fork and thereby to maintain the fork in sustained continuous vibration.

5. A frequency stabilized oscillator for self-generation of sustained oscillations comprising a tuning fork having a magnetostrictive section and a magnetomotive section, a magnetostrictive fork driving winding coupled to said magnetostrictive section, a magnetomotive pickup winding coupled to said magnetomotive section, and means including feed back circuit connections between both said windings to provide self-sustaining driving energy to the fork and thereby to maintain the fork in sustained continuous vibration.

6. A frequency stabilized oscillator for self-generation of sustained oscillations comprising a tuning fork having a non-bifurcated section terminating in a bifurcated section, the latter constituting the fork tines, said non-bifurcated section being constructed of magnetostrictive material, first coil means surrounding said non-bifurcated section and coupled therewith for magnetostrictive action, and second coil means adjacent each of the fork tines and coupled thereto for magnetomotive action therewith, the first coil means being symmetrically located in balanced relation with respect to the second coil means.

7. A frequency stabilized oscillator according to claim 6, in which one of said coil means is connected to the output of an amplifier and the other of said coil means is connected to the input of said amplifier, whereby one coil means acts as a fork driving system and the other coil means acts as a pickup system.

8. A frequency stabilized oscillator according to claim 6, in which said second coil means comprises a pair of electromagnets each located in magnetomotive coupling relation with a corresponding one of the fork tines, said electromagnets being symmetrically located so that stray fields from the first coil means has negligible effect on the driving power applied to the fork tines.

9. In a tuning fork oscillator for self-generation of sustained oscillations comprising a fork having a non-bifurcated section terminating in a bifurcated section, the latter of which constitutes the fork tines, said fork including a section of magnetostrictive material, a balanced magnetomotive system coupled with said tines, and a winding surrounding said magnetostrictive section of the fork for magnetostrictive control thereof.

10. In a tuning fork oscillator for generating sustained oscillations, a fork comprising a non-bifurcated section terminating in a bifurcated section, the latter of which constitutes the fork tines, said fork being composed at least in part of magnetostrictive material, pickup means responsive to the vibration of said tines, and fork driving means electrically connected to said pickup means and in inductive relation to said fork for maintaining said fork in vibration, one of said means including a winding surrounding the fork at the non-bifurcated section of the fork and the other of said means including a magnetomotive system in inductive relation to the fork tines, the said magnetomotive system being symmetrically located with respect to the fork tines so as to be unresponsive to vibrations of the fork in a reed-type mode of vibration resulting from external movement or impact of the fork.

11. In a tuning fork oscillator for generating sustained oscillations, a fork comprising a non-bifurcated section terminating in a bifurcated section, the latter of which constitutes the fork tines, said fork being composed at least in part of magnetostrictive material, pickup means responsive to the vibration of said tines, fork driving means electrically connected to said pickup means and in inductive relation to said fork for maintaining said fork in vibration, one of said means including a winding surrounding the fork at the non-bifurcated section of the fork and the other of said means including a magnetomotive system in inductive relation to the fork tines, and ferromagnetic segments carried by the respective tips of the fork tines.

12. In a tuning fork oscillator for generating sustained oscillations, a fork comprising a non-bifurcated section terminating in a bifurcated section, the latter of which constitutes the fork tines, said fork being composed at least in part of magnetostrictive material, pickup means responsive to the vibration of said tines, and fork driving means electrically connected to said pickup means and in inductive relation to said fork for maintaining said fork in vibration, one of said means including a winding surrounding the fork at the non-bifurcated section of the fork and the other of said means including a magnetomotive system in inductive relation to the fork tines, said magnetomotive system being symmetrically located with respect to the fork tines so as to be responsive to the vibration of the fork tines as a tuning fork, while being unresponsive to reed-type vibration of the fork resulting from external movement or impact on the fork, and the said winding is magnetostrictively coupled as a driving winding to the fork.

13. In a tuning fork oscillator for generating sustained oscillations, a fork comprising a non-bifurcated section terminating in a bifurcated section, the latter of which constitutes the fork tines, said fork being composed at least in part of magnetostrictive material, pickup means responsive to the vibration of said tines, and fork driving means electrically connected to said pickup means and in inductive relation to said fork for maintaining said fork in vibration, one of said means including a winding surrounding the fork at the non-bifurcated section of the fork and the other of said means including a magnetomotive system in inductive relation to the fork tines, the said magnetomotive system being symmetrically located with respect to the fork tines to drive the fork by magnetomotive action while being unresponsive to reed-type vibration of the fork resulting from external movement or impact and being substantially unaffected by stray fields from said winding.

References Cited in the file of this patent

UNITED STATES PATENTS

| | | |
|---|---|---|
| 1,637,442 | Dorsey | Aug. 2, 1927 |
| 1,977,939 | Fichandler | Oct. 23, 1934 |
| 2,113,365 | Artzt | Apr. 5, 1938 |
| 2,466,018 | Ferrill | Apr. 5, 1949 |
| 2,469,005 | Russell | May 3, 1949 |
| 2,571,019 | Donley et al. | Oct. 9, 1951 |

FOREIGN PATENTS

| | | |
|---|---|---|
| 510,927 | Great Britain | Aug. 10, 1939 |